(12) United States Patent
Hadidi et al.

(10) Patent No.: US 8,692,468 B2
(45) Date of Patent: Apr. 8, 2014

(54) TRANSFORMER-COUPLED RF SOURCE FOR PLASMA PROCESSING TOOL

(75) Inventors: Kamal Hadidi, Somerville, MA (US); Rajesh Dorai, Woburn, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 94 days.

(21) Appl. No.: 13/251,819

(22) Filed: Oct. 3, 2011

(65) Prior Publication Data

US 2013/0082599 A1 Apr. 4, 2013

(51) Int. Cl.
*H01J 7/24* (2006.01)

(52) U.S. Cl.
USPC ............ 315/111.81; 315/111.21; 315/111.41; 315/111.51

(58) Field of Classification Search
USPC ........ 250/423 R; 315/111.21, 111.81, 111.41
See application file for complete search history.

(56) References Cited

U.S. PATENT DOCUMENTS

| | | | |
|---|---|---|---|
| 4,713,585 A * | 12/1987 | Ohno et al. ............. | 315/111.81 |
| 5,435,881 A | 7/1995 | Ogle | |
| 5,998,933 A * | 12/1999 | Shun'ko ................. | 315/111.51 |
| 6,321,681 B1 | 11/2001 | Colpo et al. | |
| 6,417,626 B1 | 7/2002 | Brcka et al. | |
| 7,363,876 B2 | 4/2008 | Lai et al. | |
| 7,514,875 B2 | 4/2009 | Shun'ko | |
| 7,700,465 B2 | 4/2010 | Collins et al. | |
| 8,035,056 B2 * | 10/2011 | Kwon et al. ............. | 219/121.43 |
| 8,188,445 B2 * | 5/2012 | Godet et al. ............. | 250/423 R |
| 8,317,970 B2 * | 11/2012 | Lai et al. ................. | 156/345.48 |
| 8,344,318 B2 * | 1/2013 | Hadidi et al. ................ | 250/288 |
| 2003/0193294 A1 | 10/2003 | Wahlin | |
| 2007/0137576 A1 | 6/2007 | Kurunczi et al. | |
| 2008/0088242 A1 | 4/2008 | Shun'ko | |
| 2009/0294065 A1 * | 12/2009 | Lai et al. .................. | 156/345.47 |
| 2011/0309049 A1 * | 12/2011 | Papasouliotis et al. ......... | 216/37 |
| 2012/0255491 A1 * | 10/2012 | Hadidi .......................... | 118/712 |

* cited by examiner

*Primary Examiner* — Daniel Cavallari
*Assistant Examiner* — Srinivas Sathiraju

(57) ABSTRACT

A RF source and method are disclosed which inductively create a plasma within an enclosure without an electric field or with a significantly decreased creation of an electric field. A ferrite material with an insulated wire wrapped around its body is used to efficiently channel the magnetic field through the legs of the ferrite. This magnetic field, which flows between the legs of the ferrite can then be used to create and maintain a plasma. In one embodiment, these legs rest on a dielectric window, such that the magnetic field passes into the chamber. In another embodiment, the legs of the ferrite extend into the processing chamber, thereby further extending the magnetic field into the chamber. This ferrite can be used in conjunction with a PLAD chamber, or an ion source for a traditional beam line ion implantation system.

13 Claims, 14 Drawing Sheets

TRANSFORMER-COUPLED RF SOURCE FOR PLASMA PROCESSING TOOL

BACKGROUND

A plasma processing apparatus generates a plasma in a chamber which can be used to treat a workpiece supported by a platen in a process chamber. In some embodiments, the chamber in which the plasma is generated is the process chamber. Such plasma processing apparatus may include, but not be limited to, doping systems, etching systems, and deposition systems. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

In other embodiments, the plasma may be generated in one chamber, which ions are extracted from, and the workpiece is treated in a different process chamber. One example of such a configuration may be a beam line ion implanter where the ion source utilizes an inductively coupled plasma (ICP) source. The plasma is generally a quasi-neutral collection of ions (usually having a positive charge) and electrons (having a negative charge). The plasma has an electric field of about 0 Volts per centimeter in the bulk of the plasma.

Turning to FIG. 1, a block diagram of one exemplary plasma processing apparatus 100 is illustrated. The plasma processing apparatus 100 includes a process chamber 102 defining an enclosed volume 103. A gas source 104 provides a primary dopant gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma processing apparatus 100 may further includes a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma processing apparatus further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

In some embodiments, the planar antenna 126 and helical antenna 146 comprise a conductive material wound in a spiraling pattern. For example, FIG. 2A shows one embodiment of a traditional planar antenna 126, while FIG. 2B shows a second embodiment. FIG. 3 shows a traditional helical antenna 146.

Turning back to FIG. 1, the plasma processing apparatus may also include a bias power supply 190 electrically coupled to the platen 134. The plasma processing system may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma processing apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current.

In operation, the gas source 104 supplies a primary dopant gas containing a desired dopant for implantation into the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a pulsed platen signal having a pulse ON and OFF periods to bias the platen 134 and hence the workpiece 138 to accelerate ions 109 from the plasma 140 towards the workpiece 138. The ions 109 may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy.

FIG. 4 shows a block diagram of a conventional ion implanter 300. Of course, many different ion implanters may be used. The conventional ion implanter may comprise an ion source 302 that may be biased by a power supply 301. The system may be controlled by controller 320. The operator communicates with the controller 320 via user interface system 322. The ion source 302 is typically contained in a vacuum chamber known as a source housing (not shown). The ion implanter system 300 may also comprise a series of beam-line components through which ions 10 pass. The series of beam-line components may include, for example, extraction electrodes 304, a 90° magnet analyzer 306, a first deceleration (D1) stage 308, a 70° magnet collimator 310, and a second deceleration (D2) stage 312. Much like a series of optical lenses that manipulate a light beam, the beam-line components can manipulate and focus the ion beam 10 before steering it towards a workpiece or wafer 314, which is disposed on a workpiece support 316.

In operation, a workpiece handling robot (not shown) disposes the workpiece 314 on the workpiece support 316 that can be moved in one or more dimensions (e.g., translate, rotate, and tilt) by an apparatus, sometimes referred to as a "roplat" (not shown). Meanwhile, ions are generated in the ion source 302 and extracted by the extraction electrodes 304. The extracted ions travel in a beam-like state along the beamline components and implanted on the workpiece 314. After implanting ions is completed, the workpiece handling robot may remove the workpiece 314 from the workpiece support 316 and from the ion implanter 300.

The ion source 302 may be an inductively coupled plasma (ICP) ion source. In some embodiments, such as in FIGS. 5A-B, the ion source 302 may comprise a rectangular enclosure, having an extraction slit 335 on one side 337. In certain embodiments, the side 336 opposite the extraction slit 335 may be made of a dielectric material, such as alumina, such that a planar antenna 338 may be placed against the dielectric wall 336 to create a plasma within the enclosure 302. The enclosure 302 also has a top surface 339, a bottom surface 341, and two endwalls 338, 340.

In another embodiment, a helical antenna 350 is wrapped around the endwalls 338, 340 and the top surface 339 and bottom surface 341 of the ion source 302.

One drawback of conventional plasma processing is the creation of metals within the chamber. These metals are generally generated by ions bombarding the walls of the dielectric window of the plasma-generating source at high energy. In inductively coupled RF plasmas, there is a capacitive component due to the high voltages on the RF coil. This capacitive component creates an electric field that is responsible for the metal generation in the RF source. Therefore, there is a need for an RF source which produces the magnetic field necessary for inductively generating a plasma without the associated electrical field or with a significantly decreased associated electrical field.

SUMMARY

A RF source and method are disclosed which inductively create a plasma within an enclosure without the associated electric field or with a significantly decreased creation of an electric field. A ferrite material is used to create a magnetic field. An insulated wire is wrapped around the body of the ferrite, which creates a magnetic field between the legs of the ferrite. This magnetic field can then be used to create a plasma. In one embodiment, these legs rest on a dielectric window, such that the magnetic field passes into the chamber. In another embodiment, the legs of the ferrite extend into the processing chamber, thereby further extending the magnetic field into the chamber. This RF source can be used in conjunction with a PLAD chamber, or an ion source for a traditional beam line ion implantation system.

BRIEF DESCRIPTION OF THE DRAWINGS

For a better understanding of the present disclosure, reference is made to the accompanying drawings, in which like elements are referenced with like numerals, and in which.

DETAILED DESCRIPTION

As described above, traditional ICP ion sources typically produce an electrical field, due to the capacitance introduced due to the high voltages in the antennas 126, 146.

Figure 6:
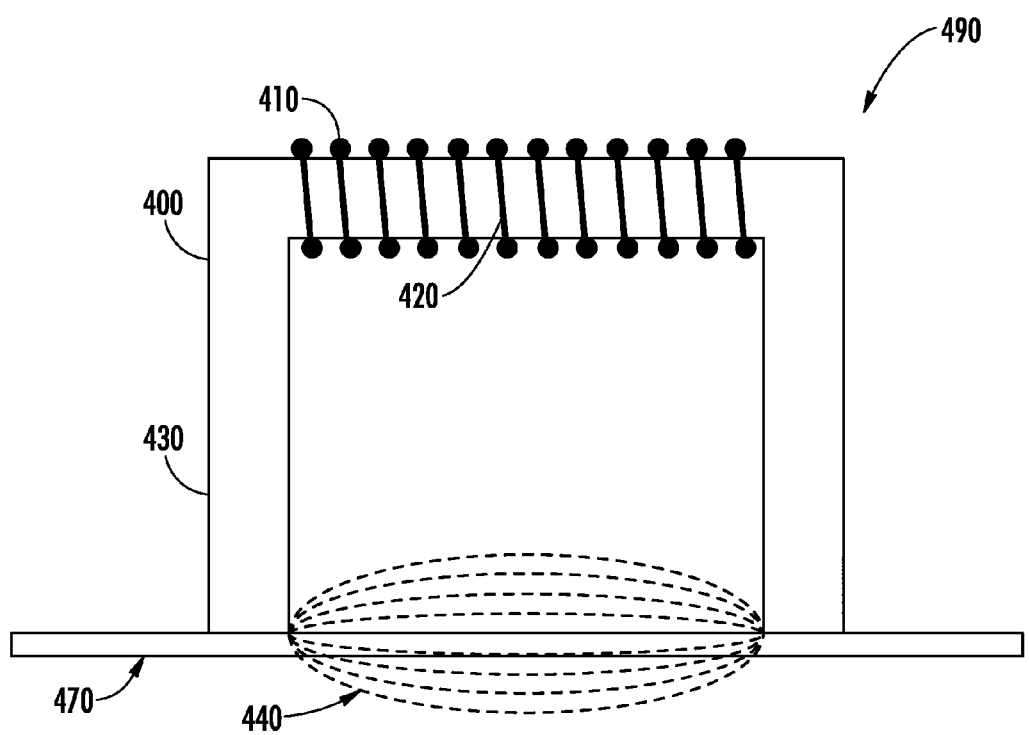
FIG. 6 is a cross-sectional view of an embodiment of the transformer coupled RF source resting on a dielectric window.

As shown in cross-section in FIG. 6, the RF source 490 uses a mechanism, where a coil 410 is would around ferrite 400, which is u-shaped in this instance. The ferrite 400 has a main body 420, around which the coil 410 is wound, and two legs 430 extending perpendicularly from the ends of the main body 420. An alternating current is passed through the coil 410, which may be an insulated wire in one instance. The current in the coil 410 creates a magnetic field in the ferrite 400. This alternating current has a frequency, such as between 50 kHz and 50 MHz. The magnitude of the current may vary, based on the amount of power that is dedicated to creating this field. In addition, the strength of the magnetic field is also a function of the spacing between the legs 430, and this parameter affects the amount of power required to create the desired magnetic field.

The ferrite can be constructed from various materials. In some embodiments, the choice of material is related to the frequency of the alternating current. For example, manganese zinc ferrites are preferably used for frequencies up to 500 kHz, while nickel zinc ferrites can be used for higher frequencies.

Most of the magnetic field created by the current passing through the coil 420 is captured by the ferrite 400. The magnetic field lines 440 close near the distal ends of the legs 430 of the ferrite 400, thereby creating a localized magnetic field with little to no electrical field.

The RF source can be positioned on a surface in several different ways. As shown in FIG. 6, the RF source 490 may be placed on a dielectric window 470 such that the distal ends of the legs 430 are in contact with the dielectric window 470. Materials such as quartz and alumina may be used for this dielectric window 470. In this embodiment, the magnetic field 440 may not extend significantly into the chamber, which is located on the opposite side of the dielectric window 470.

Figure 7A:
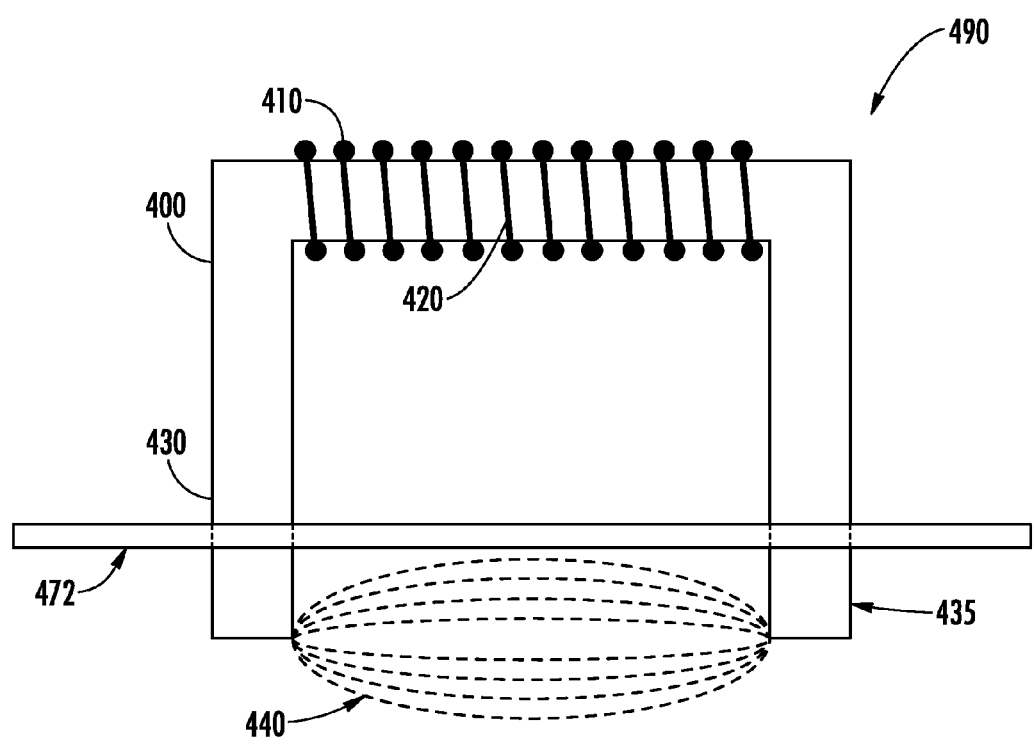
FIG. 7A is a cross-sectional view of an embodiment of the transformer coupled RF source extending into the plasma processing chamber.

In another embodiment, shown in FIG. 7A, the distal ends of the legs 430 of the ferrite 400 extend beyond the wall 472. Wall 472 does not need to be dielectric in this embodiment, since the magnetic field is generated on the opposite side of the wall 472, within the plasma processing chamber. In fact, wall 472 may be any material, including a dielectric material or a metal, such as aluminum. In this embodiment, because of the location of the distal ends of the legs 430, the magnetic field 440 extends further within the chamber formed by the wall 472. The ferrite extensions 435 can be created in several ways. In one embodiment, the wall 472 is cut out, such that the distal ends of legs 430 of the ferrite 400 are placed in the cut out portions and extend through these cutouts. In this embodiment, the leg extensions 435 are preferably bonded to the wall 472, preferably in an airtight manner. Various glues or seals, such as o-rings, may be used to create this bond. The introduction of the leg extensions 435 into the chamber may be a source of particulates. In some embodiments, the legs 430, and specifically the leg extensions 435, are coated with silicon to minimize the amount of contamination introduced to the chamber.

Figure 7B:
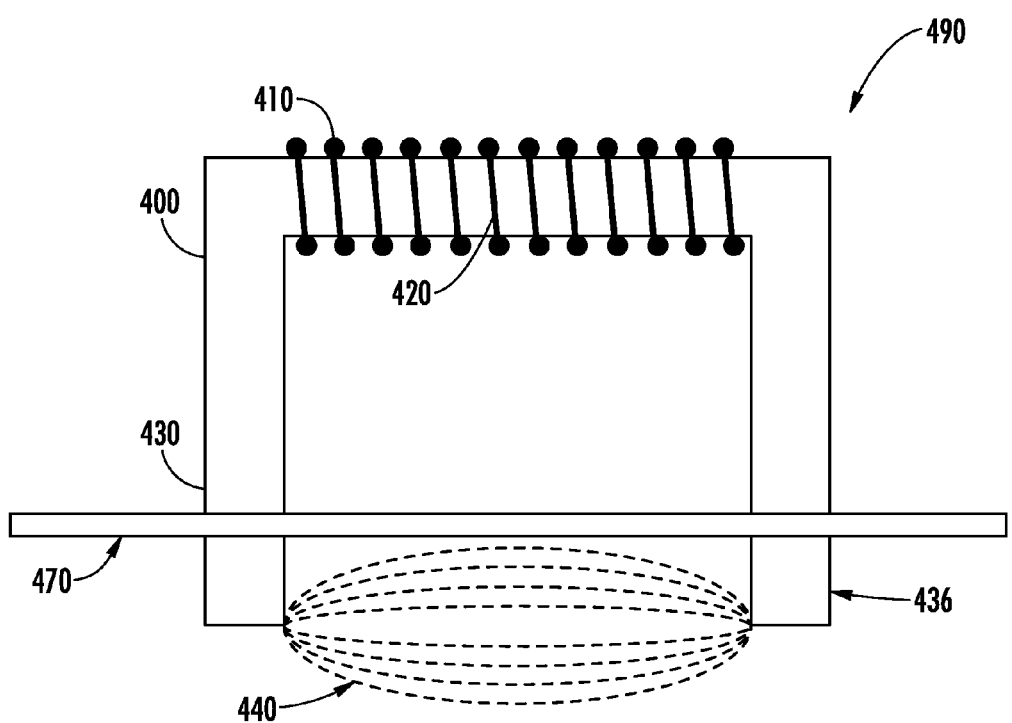
FIG. 7B is a cross-sectional view of an embodiment of the transformer coupled RF source resting on a dielectric window with separate ferrite extensions on the opposite side of the window.

In another embodiment, shown in FIG. 7B, the legs 430 of the ferrite 400 sit on the dielectric window 470. Separate ferrite extensions 436 may be added inside the chamber formed by the dielectric window 470, opposite each of the distal ends of the legs 430 to extend the magnetic channel inside the chamber. As described above, these separate ferrite extensions 436 may be coated with silicon to minimize contamination.

This RF source 490 can be formed in a variety of shapes and sizes. In some embodiments, the legs 430 are sufficiently long so that the electric field surrounding the coil 420 does not reach the window 470. The width of the main body 410, which determines the spacing between the legs 430 may be varied. In embodiments where the legs are spaced relatively close together, the magnetic field density is high, however it is also highly localized. In contrast, where the legs 430 are spaced apart, the magnetic density decreases, but the magnetic field is more distributed. Therefore, there is a tradeoff between power supplied to the coil 420, the spacing between the legs 430, and the uniformity and density of the magnetic field 440 created.

Figure 1:
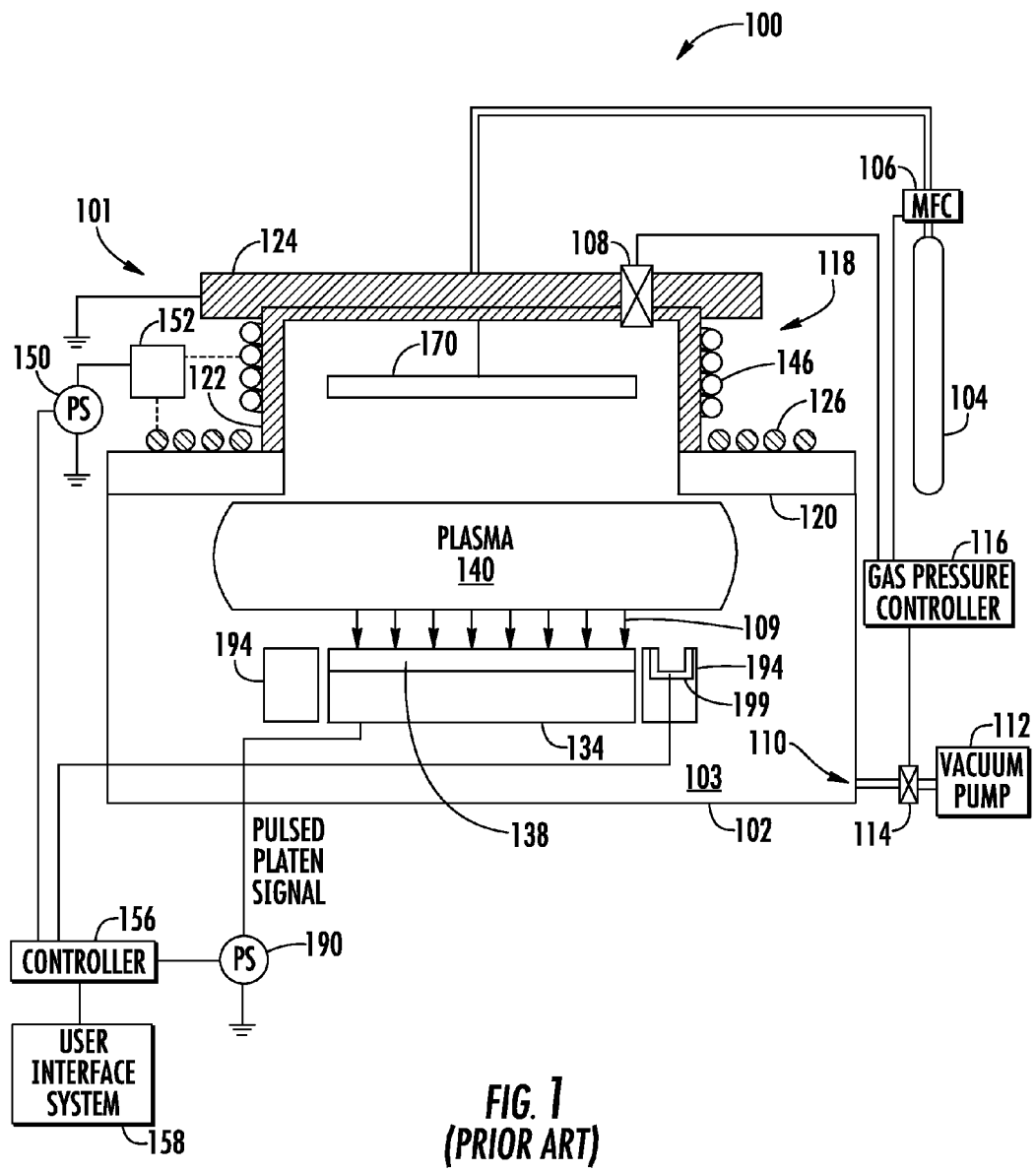
FIG. 1 is a block diagram of a plasma processing apparatus of the prior art.
Figure 2A:
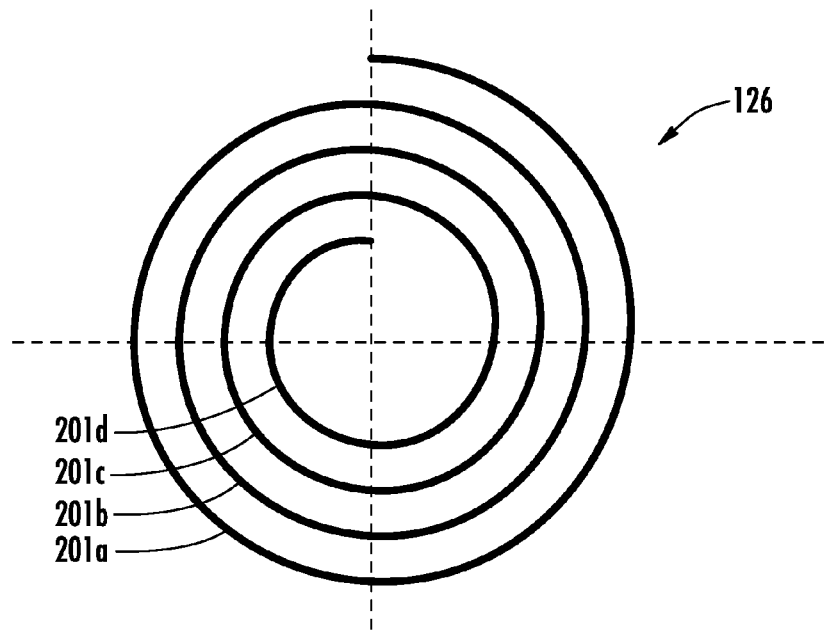
FIGS. 2A-B illustrate planar antenna of the prior art.
Figure 2B:
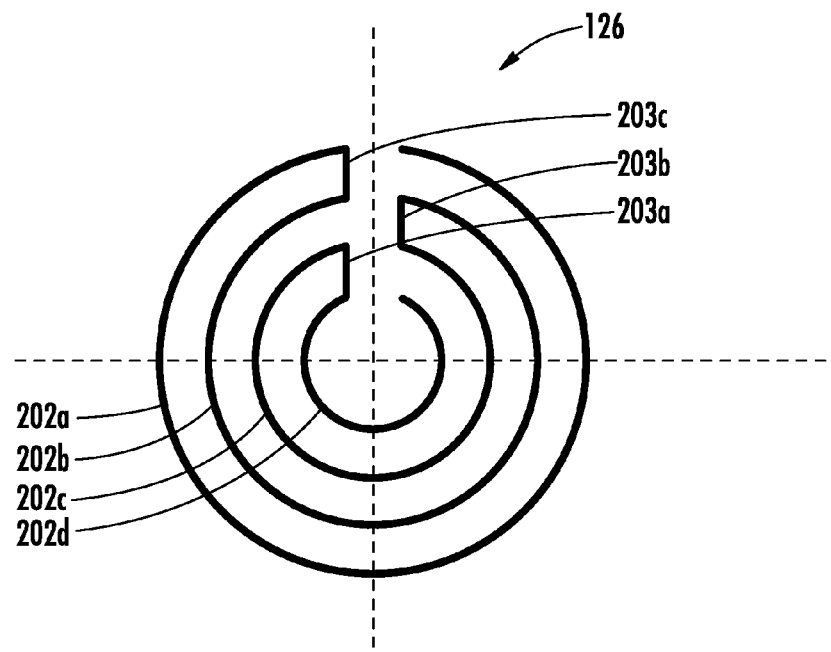
Figure 3:
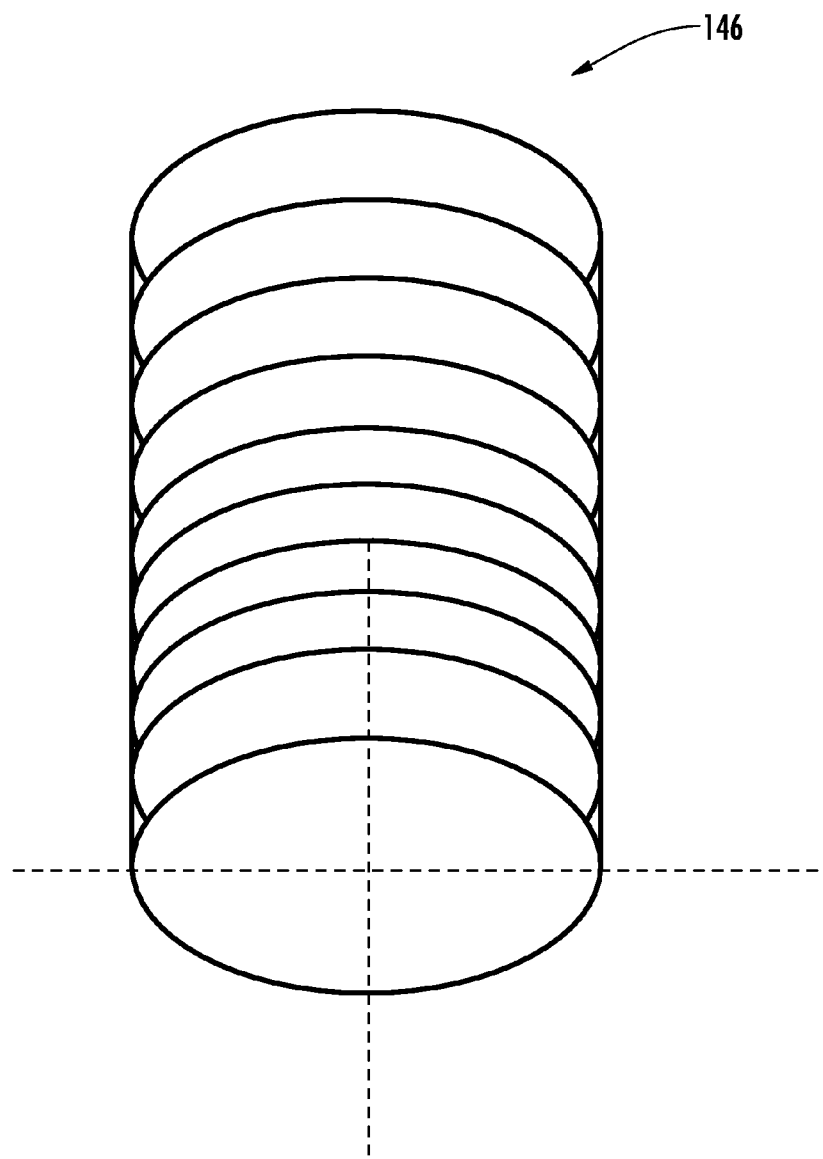
FIG. 3 illustrates a helical antenna of the prior art.
Figure 4:
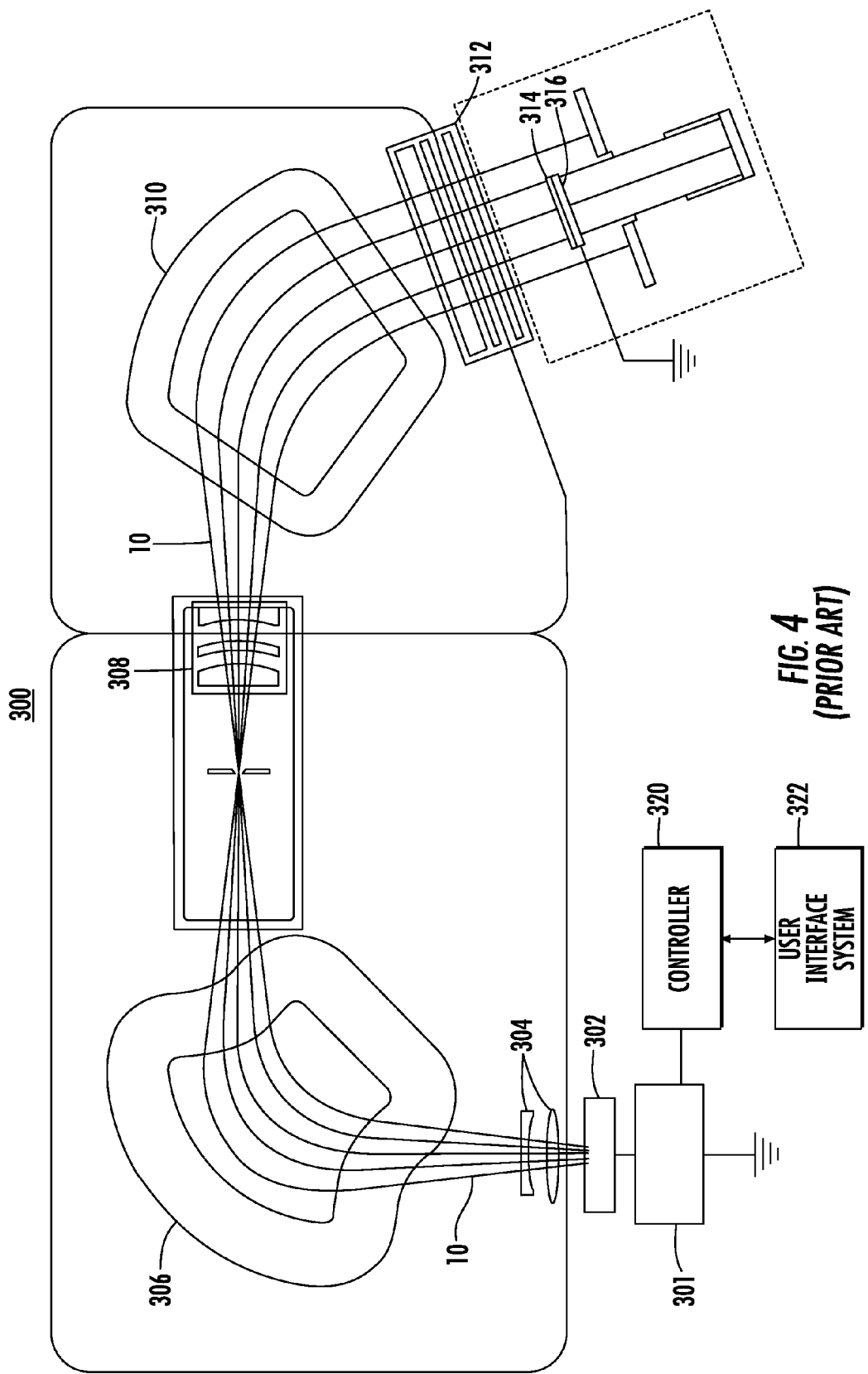
FIG. 4 is a block diagram of a ion implantation apparatus.
Figure 8:
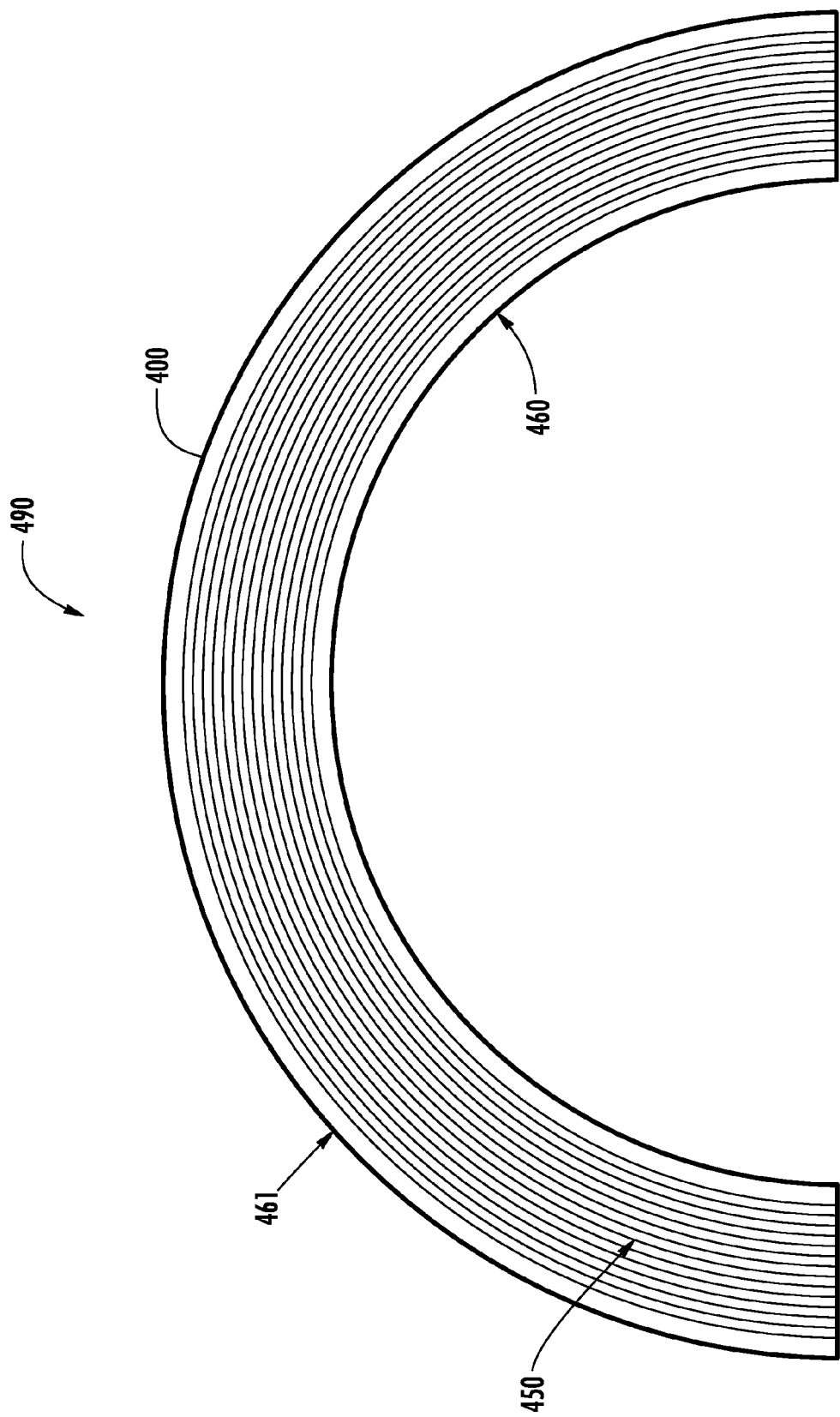
FIG. 8 is top view of a first embodiment of the transformer coupled RF source of FIG. 6 or FIG. 7.

In one embodiment, the top view of which is shown in FIG. 8, the ferrite 400 is semi-circular. This shape may be used in conjunction with a plasma processing chamber 104, such as the one shown in FIG. 1. In this embodiment, the ferrite may be semi-circular, with coils 450 that also follow a semi-circular path, approximately parallel to the legs. The legs (not shown) extend downward from inner edge 460 and outer edge 461. This configuration creates a semi-circular annular magnetic field, where the field is located between the legs extending downward from edges 460, 461. While a semi-circular ferrite 400 is shown, other shapes are possible, such as quarter circles, semi-oval and others.

Figure 9:
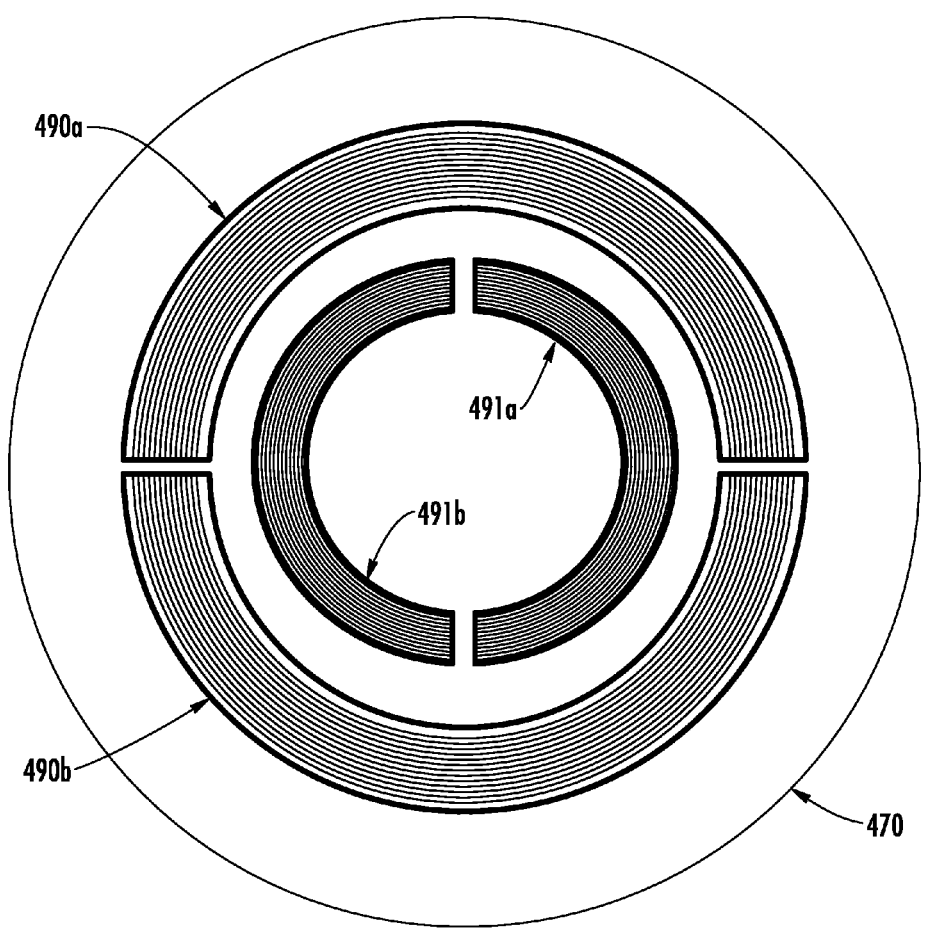
FIG. 9 is a top view showing several RF sources of FIG. 8 positioned on a dielectric window.

As the RF source 490 of FIG. 8 only creates a semi-circular annular magnetic field, in some embodiments, two such ferrites may be arranged to form a complete circle, as shown in FIG. 9. In this embodiment, two identical RF sources 490a, 490b are arranged in a circular pattern so as to create an annular magnetic field. In some embodiments, these RF sources 490a, 490b are placed atop a dielectric window 470, such that the magnetic field permeates the dielectric window 470 and the chamber (as shown in FIG. 6). In other embodiments, the legs of the RF sources 490a, 490b extend into the chamber, as shown in FIG. 7A. In other embodiments, ferrite extensions are disposed on the dielectric window 470 in the chamber, opposite the distal ends of the legs.

In some embodiments, the discontinuities in the magnetic field between RF sources 490a, 490b may be undesirable, and may cause plasma non-uniformity. In such embodiments, third and fourth smaller RF sources 491a, 491b may be inserted within the circle created by RF sources 490a, 490b, as shown in FIG. 9. These RF sources 491a, 491b are preferably concentric with RF sources 490a, 490b and are arranged so that the openings between them are rotated a quarter turn from the openings between RF sources 490a, 490b. As described above, these RF sources 490, 491 may sit atop a dielectric window 470, as shown in FIG. 6, or may extend into the plasma processing chamber, as shown in FIG. 7. Of course, other variations, dimensions, or rotations than that illustrated in FIG. 9 are possible.

Figure 10:
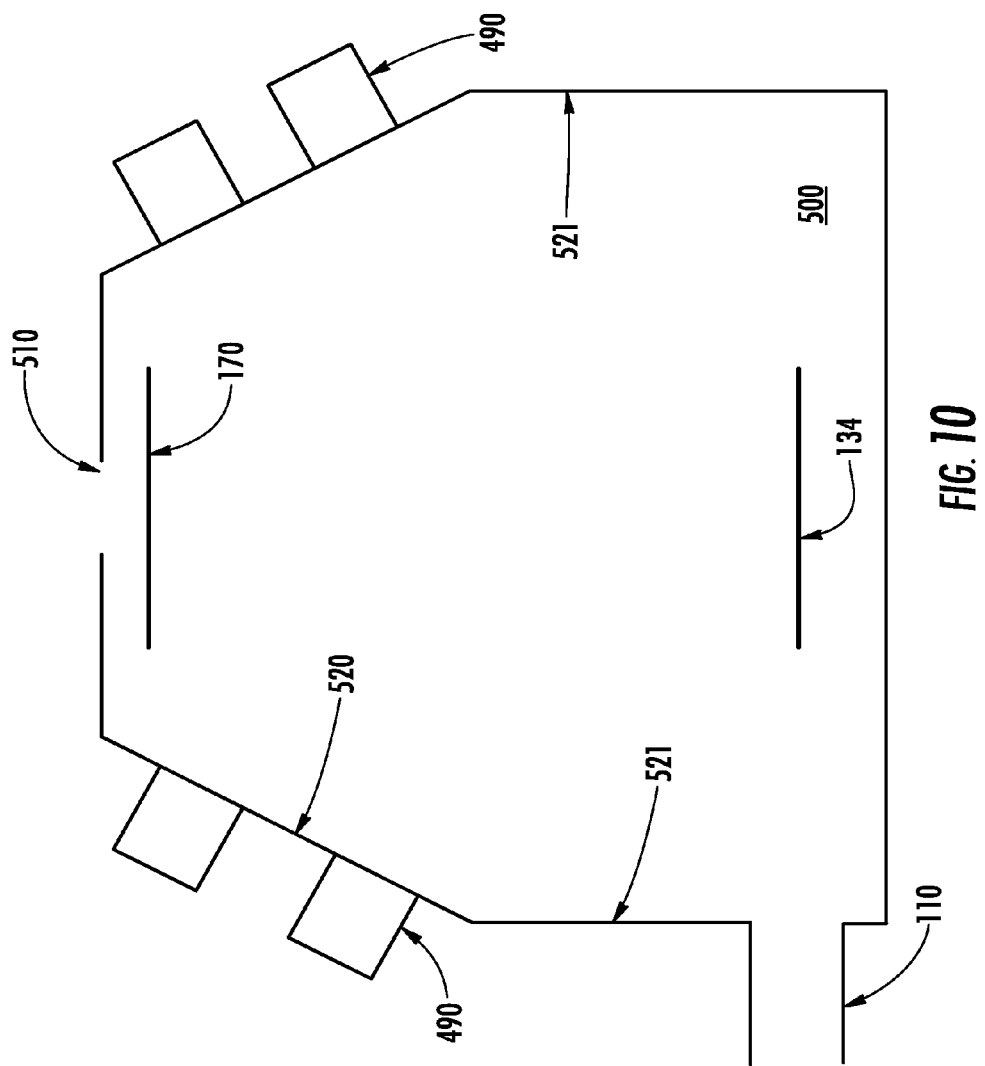
FIG. 10 is a cross-sectional view of a PLAD chamber showing the embodiment of FIG. 9.

FIG. 10 shows the RF sources 490 of FIG. 9 used in conjunction with a plasma processing chamber 500. As described in conjunction with FIG. 1, the plasma processing chamber 500 has a gas inlet 510, a baffle 170, a platen 134, and an exhaust port 110. In one embodiment, the RF sources 400 may be disposed on dielectric windows 520. The dielectric windows 520 may extend along a vertical direction at an oblique angle relative to the chamber walls 521, as shown in FIG. 10. In other embodiments, the dielectric windows 520 may be perpendicular to the chamber walls 521.

In another embodiment, the legs 430 of the ferrites may extend through the windows 520 into the chamber 500. In this embodiment, the windows 520 need not be constructed of dielectric material. Although the windows 520 are shown as slanted, other embodiments are possible. For example, in another embodiment, the RF sources 490 may replace the antennas 126, 146 shown in FIG. 1.

Figure 11:
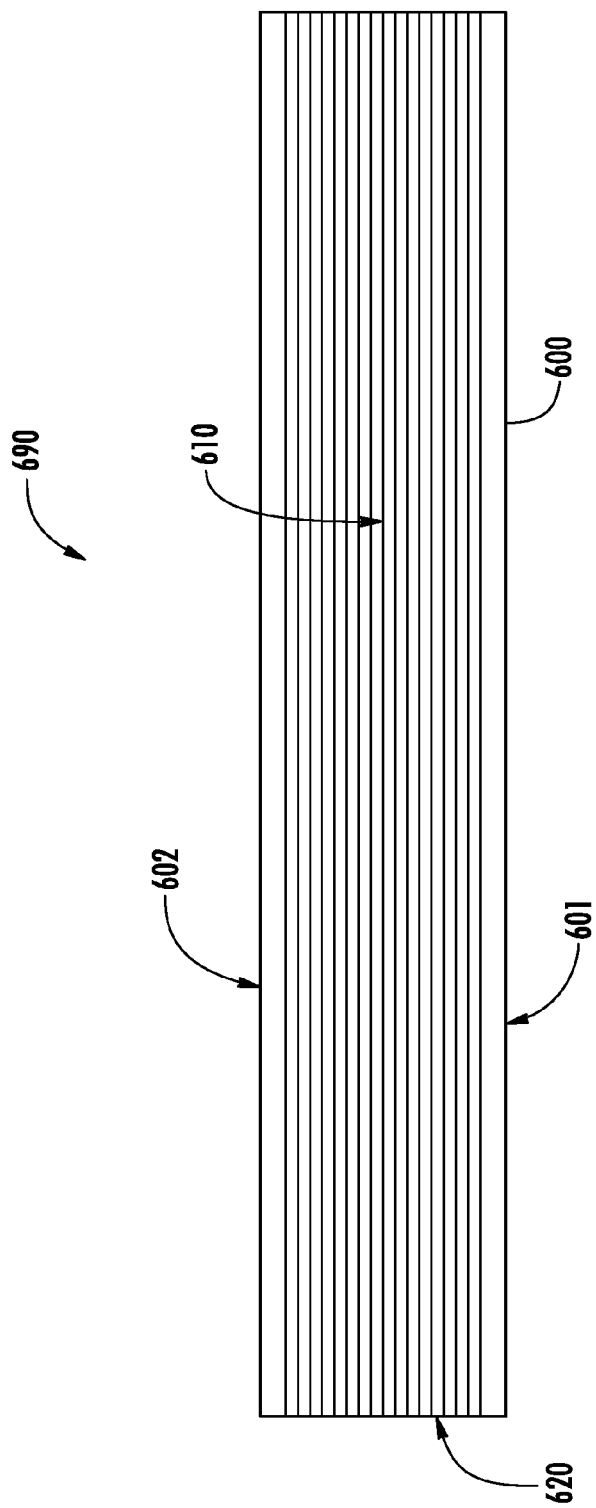
FIG. 11 is a top view of a second embodiment of the transformer coupled RF source of FIG. 7.

FIG. 11 shows a top view of a second embodiment of the RF source 690. In this embodiment, the main body 620 of the ferrite 600 is straight, rather than semi-circular. Coils 610 are wound around the main body 620. The main body 620 has two edges 601, 602, which are approximately parallel to the path of the coils 610. The legs (not shown) extend downward from these edges 601, 602.

Figure 5A:
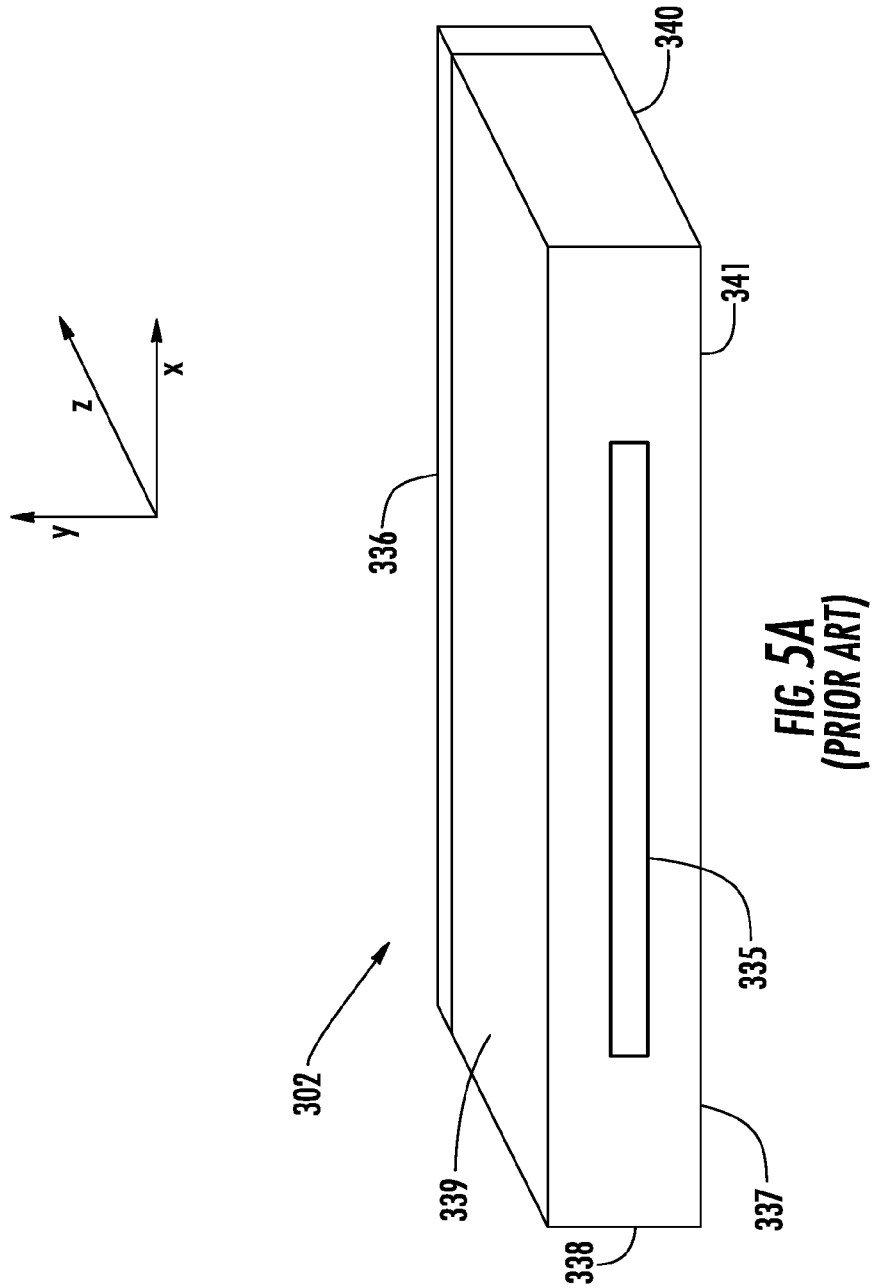
FIG. 5A is a front view of one embodiment of an ICP source.
Figure 5B:
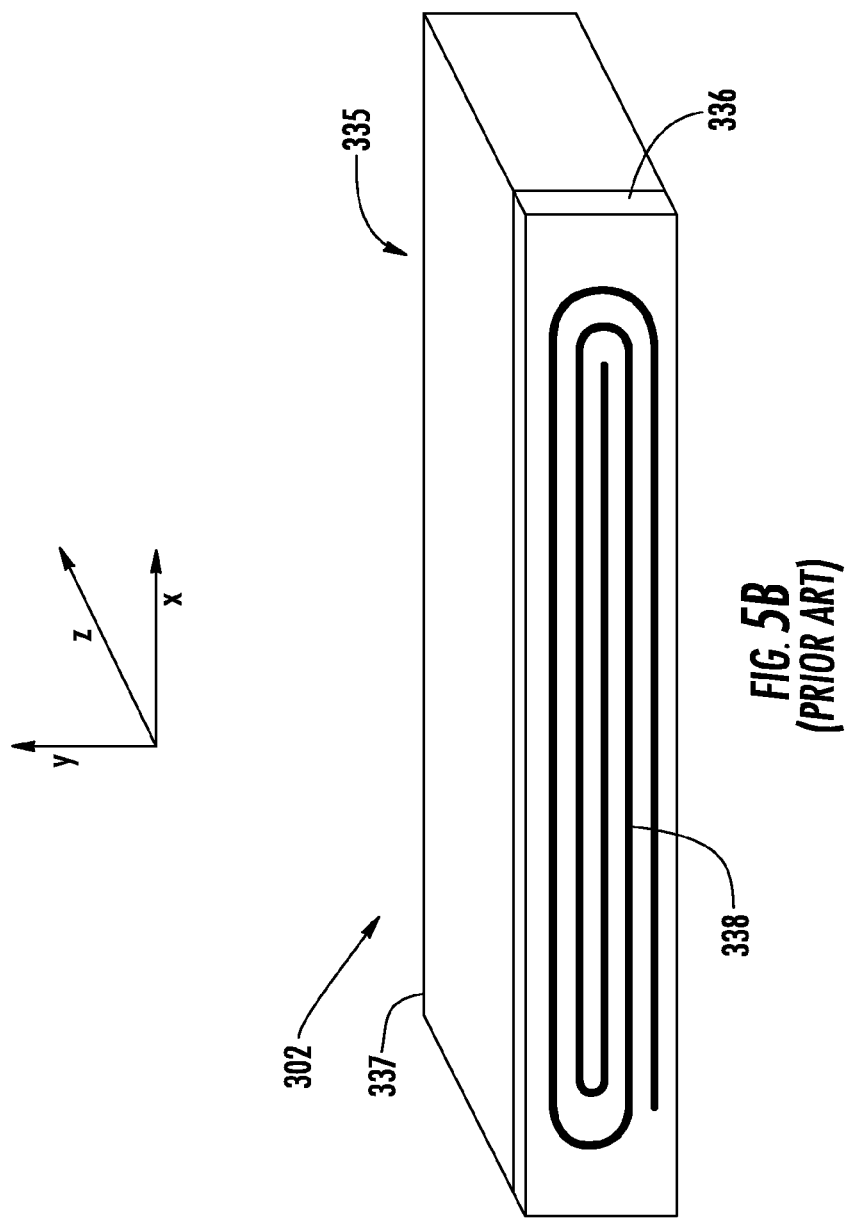
FIG. 5B is a rear view of the embodiment of FIG. 5A.
Figure 12:
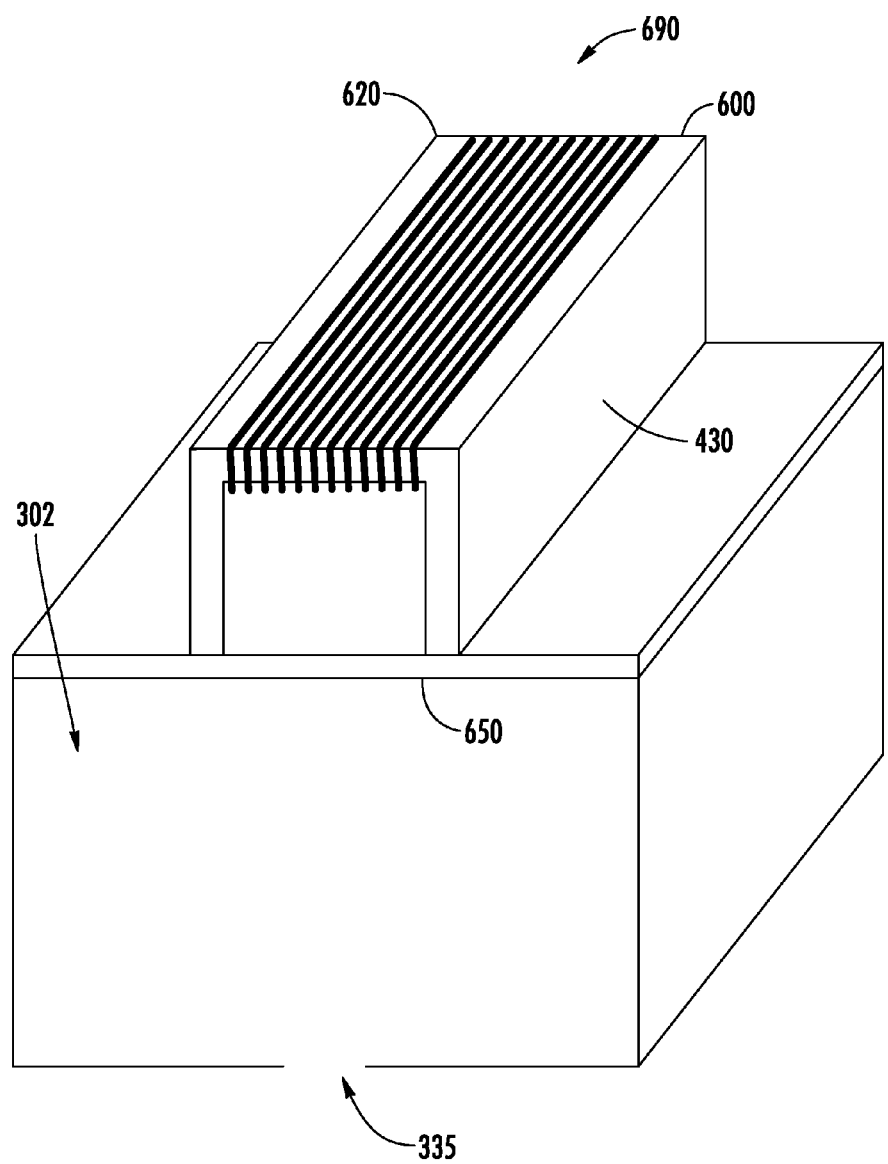
FIG. 12 shows a perspective view of an ion source for a beam line implanter using the embodiment of FIG. 11.

FIG. 12 shows a perspective view of an ion source, such as that shown in FIGS. 5A-B, being used in conjunction with RF source 690. In this embodiment, the RF source 690 is placed on a dielectric window 650 on the side of the rectangular enclosure 302 directly opposite extraction slit 335. The ferrite 600 may be roughly the same length as the rectangular enclosure 302. Since the magnetic field created between legs 430 is uniform along the length of the main body 620, the resulting plasma density within the rectangular enclosure 302 should likewise be uniform across the length of the enclosure 302. In another embodiment, the ferrite 600 may be positioned such that the legs 430 extend into the rectangular enclosure 302, as shown in FIG. 7A. In this embodiment, the top surface 650 does not need to be a dielectric material. In another embodiment, ferrite extensions are used to extend the ferrite legs into the chamber, as shown in FIG. 7B. In this embodiment, the top surface is a dielectric material.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
an enclosure, having an extraction slit on a first side; and an RF source positioned on a second side of said enclosure opposite said extraction slit, said RF source comprising:
  a ferrite, having a main body and two legs extending perpendicularly downward from opposite ends of said main body, each leg having a distal end disposed away from said main body; and
  a coil wound around at least one of said main body and said two legs; and
a power supply configured to supply current to said coil, said current used to create a localized magnetic field between said distal ends of said legs.

2. The ion source of claim 1, wherein said coil is wound around said main body, the path of said coils approximately parallel said legs.

3. The ion source of claim 1, wherein a dielectric material is disposed in said second side, and said distal end of said legs of said ferrite are disposed on said dielectric material.

4. The ion source of claim 3, wherein the RF source further comprises first and second ferrite extensions located within said enclosure disposed on said dielectric window opposite said distal end of said legs.

5. The ion source of claim 1, wherein a portion of said legs of said ferrite extends into said rectangular enclosure.

6. The ion source of claim 5, wherein said portion of said legs is coated with silicon.

7. An ion source, comprising:
a rectangular enclosure, having a length, a width and a depth, comprising:
  a first side, having said length and said width;
  a second side opposite said first side;
  an extraction slit disposed on said first side, said slit having its longer dimension along said length; and
an RF source positioned on said second side, said RF source comprising:
  a ferrite, having a main body, and two legs extending perpendicularly downward from opposite ends of said main body, each leg having a distal end disposed away from said main body, wherein wherein said main body and said legs have a dimension similar to said length; and
  a coil wound around said main body in a direction substantially parallel to said longer dimension of said slit; and
a power supply configured to supply current to said coil, said current used to create a localized magnetic field between said distal ends of said legs.

8. The ion source of claim 7, wherein a dielectric material is disposed in said second side, and said distal end of said legs of said ferrite are disposed on said dielectric material.

9. The ion source of claim 8, wherein the RF source further comprises first and second ferrite extensions located within said enclosure disposed on said dielectric window opposite said distal end of said legs.

10. The ion source of claim 7, wherein a portion of said legs of said ferrite extends into said rectangular enclosure.

11. The ion source of claim 10, wherein said portion of said legs is coated with silicon.

12. The ion source of claim 7, wherein said localized magnetic field is perpendicular to said longer dimension of said extraction slit.

13. The ion source of claim 7, wherein said localized magnetic field is uniform across said length.

* * * * *